(12) United States Patent
Wu et al.

(10) Patent No.: US 10,727,095 B2
(45) Date of Patent: Jul. 28, 2020

(54) MICRO DEVICE TRANSFER SYSTEM

(71) Applicant: Prilit Optronics, Inc., Tainan (TW)

(72) Inventors: Biing-Seng Wu, Tainan (TW); Chao-Wen Wu, Tainan (TW)

(73) Assignee: Prilit Optronics, Inc., Tainan (TW)

( * ) Notice: Subject to any disclaimer, the term of this patent is extended or adjusted under 35 U.S.C. 154(b) by 271 days.

(21) Appl. No.: 15/894,412

(22) Filed: Feb. 12, 2018

(65) Prior Publication Data
US 2018/0269087 A1   Sep. 20, 2018

(30) Foreign Application Priority Data

Mar. 15, 2017   (TW) .............................. 106108612 A

(51) Int. Cl.
| | | |
|---|---|---|
| *H01L 25/075* | (2006.01) | |
| *H01L 21/67* | (2006.01) | |
| *H01L 27/12* | (2006.01) | |
| *B25J 15/00* | (2006.01) | |
| *B65G 47/92* | (2006.01) | |

(52) U.S. Cl.
CPC .... *H01L 21/67144* (2013.01); *B25J 15/0085* (2013.01); *H01L 25/0753* (2013.01); *H01L 27/1214* (2013.01); *B65G 47/92* (2013.01)

(58) Field of Classification Search
CPC ..... B25J 9/02; B25J 9/023; B25J 9/026; B25J 9/04; B25J 9/041; B25J 9/042; B25J 9/043; B25J 9/044; B25J 9/045; B25J 9/046; B25J 15/0085; B25J 15/0608; B65G 47/92; H01L 21/67144; H01L 25/0753; H01L 27/1214
USPC .......................................................... 414/737
See application file for complete search history.

(56) References Cited

U.S. PATENT DOCUMENTS

| | | |
|---|---|---|
| 8,333,860 B1 | 12/2012 | Bibl et al. |
| 9,343,448 B2 | 5/2016 | Sakariya et al. |
| 2012/0330453 A1* | 12/2012 | Samak Sangari ...... B25J 9/1697 700/121 |
| 2017/0358503 A1* | 12/2017 | Liu ...................... H01L 21/288 |

OTHER PUBLICATIONS

Office Action dated Nov. 4, 2019 in corresponding Indian Patent Application No. 201814005247.

\* cited by examiner

*Primary Examiner* — Saul Rodriguez
*Assistant Examiner* — Brendan P Tighe
(74) *Attorney, Agent, or Firm* — Donald E. Stout; Stout, Uxa & Buyan, LLP

(57) ABSTRACT

A micro device transfer system includes a transfer head having pick-up electrodes for picking micro devices and thin-film transistors (TFTs) corresponding to the pick-up electrodes; a transfer head holder for holding the transfer head; a TFT driver board electrically connected to control the TFTs; a donor or acceptor substrate for carrying the micro devices; and a substrate holder for holding the donor or acceptor substrate.

13 Claims, 6 Drawing Sheets

MICRO DEVICE TRANSFER SYSTEM

CROSS-REFERENCE TO RELATED APPLICATIONS

This application claims priority of Taiwan Patent Application No. 106108612, filed on Mar. 15, 2017, the entire contents of which are herein expressly incorporated by reference.

BACKGROUND OF THE INVENTION

1. Field of the Invention

The present invention generally relates to a micro device transfer system, and more particularly to a micro device transfer system utilizing thin-film transistor architecture.

2. Description of Related Art

A micro light-emitting diode (microLED, mLED or gLED) display panel is one of flat display panels, and is composed of microscopic microLEDs each having a size of 1-10 micrometers. Compared to conventional liquid crystal display panels, the microLED display panels offer better contrast, response time and energy efficiency. Although both organic light-emitting diodes (OLEDs) and microLEDs possess good energy efficiency, the microLEDs, based on group III/V (e.g., GaN) LED technology, offer higher brightness, higher luminous efficacy and longer lifespan than the OLEDs.

During manufacturing a microLED display panel, individual microLEDs should be picked up and transferred to a display panel by electrostatic force, magnetic force or vacuum suction force. Conventional transfer system adopting electrostatic force mainly uses MicroElectroMechanical System (MEMS) technique, which is disadvantageously complex in architecture, high in cost and low in yield. Conventional transfer system adopting magnetic force also uses MEMS technique, and thus has complex architecture, high cost and low yield. Moreover, magnetic material needs be coated on the microLEDs with additional process and cost. Conventional transfer system adopting vacuum suction force mainly uses micro nozzles, ratio of height to diameter of which should be less than a threshold value to ensure suction capability. As the size of the microLED is small, the inner diameter and the associated height of the suction nozzle should be small enough. As a result, the vacuum suction apparatus in operation is apt to deformation or even fracture, thereby reducing suction efficiency. Accordingly, the conventional transfer system adopting vacuum suction force is not adaptable to sucking micro devices.

In consideration of manufacturing technique and cost, conventional transfer systems have limited amount of suction heads, and are therefore not adaptable to manufacturing large-size (e.g., above 10-inch) microLED display panels. Accordingly, conventional transfer systems cannot realize mass transferring microLEDs.

During sucking and transferring microLEDs, some individual microLEDs are usually not normally sucked or released in practice. Conventional transfer systems have difficulty or are not capable of individually selecting sucking heads to repair those abnormally disposed microLEDs. Therefore, conventional transfer systems cannot achieve individually repairing microLEDs.

A need has thus arisen to propose a novel micro device transfer system to overcome deficiency of conventional transfer systems.

SUMMARY OF THE INVENTION

In view of the foregoing, it is an object of the embodiment of the present invention to provide a micro device transfer system with simplified architecture and lower cost compared with conventional transfer systems. The micro device transfer system of the embodiment may realize mass transfer and individually repairing micro device. Moreover, the micro device transfer system of the embodiment may be adaptable to manufacturing large-size panels.

According to one embodiment, a micro device transfer system includes a transfer head, a transfer head holder, a thin-film transistor (TFT) driver board, a donor/acceptor substrate and a substrate holder. The transfer head includes a plurality of pick-up electrodes for respectively picking a plurality of micro devices, and includes a plurality of thin-film transistors (TFTs) respectively corresponding to the micro devices. The transfer head holder is for holding the transfer head. The TFT driver board is electrically connected to control the TFTs. The donor/acceptor substrate is for supporting the micro devices. The substrate holder is for holding the donor or acceptor substrate.

DETAILED DESCRIPTION OF THE INVENTION

Figure 1:
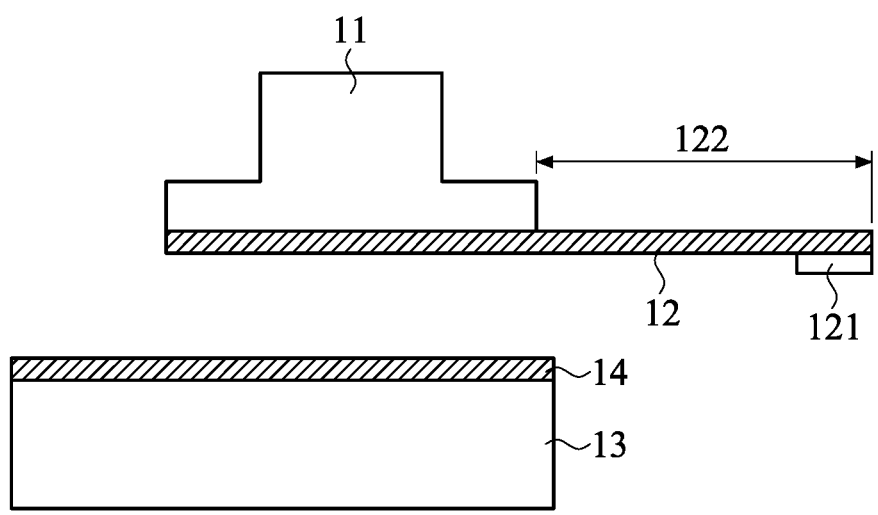
FIG. 1 schematically shows a side view illustrating a micro device transfer system according to one embodiment of the present invention.

FIG. 1 schematically shows a side view illustrating a micro device transfer system 100 according to one embodiment of the present invention. In the specification, a micro device (not shown) has a size of 1-100 micrometers. In one embodiment, the micro device is a micro light-emitting diode (microLED) having a size of 1-10 micrometers. The micro device transfer system 100 of the embodiment may be adaptable to manufacturing a large size (e.g., above 10-inch) panel.

In the embodiment, the micro device transfer system 100 may include a transfer head holder 11 for holding a transfer head 12, a top surface of which is held and attached to a bottom surface of the transfer head holder 11. A heater (not shown) beneficial to transferring and bonding the micro device may be included in the transfer head holder 11. A vacuum device (not shown) beneficial to sucking the transfer head 12 may be included in the transfer head holder 11.

The transfer head 12 of the embodiment may include a plurality of pick-up electrodes configured to picking the micro devices, disposed on a bottom surface of the transfer head 12, and located in a working area (e.g., an area covered with the transfer head holder 11). According to one aspect of the embodiment, the transfer head 12 may include a plurality of thin-film transistors (TFTs) disposed at bottom of the transfer head 12 and corresponding to the pick-up electrodes.

The transfer head 12 may include a TFT driver board 121 electrically connected to control the TFTs. The transfer head 12 of the embodiment may include an extension part 122 which extends from the working area (e.g., an area covered with the transfer head holder 11). One end of the extension part 122 is adjacent to the transfer head holder 11, and a bottom surface of another end of the extension part 122 is connected to the TFT driver board 121.

In the embodiment, the micro device transfer system 100 may include a substrate holder 13 for holding a donor or acceptor substrate 14, a bottom surface of which is held and attached to a top surface of the substrate holder 13. Accordingly, the transfer head 12 picks micro devices supported on a top surface of the donor substrate 14. After transferring, the transfer head 12 releases the micro devices, which are bonded on a top surface of the acceptor substrate 14. During the process of picking, transferring and releasing, the extension part 122 of the transfer head 12 may be used as a buffer area for preventing collision between the TFT driver board 121 and the donor/acceptor substrate 14. A heater (not shown) beneficial to transferring and bonding the micro device may be included in the substrate holder 13. A vacuum device (not shown) beneficial to sucking the donor/acceptor substrate 14 may be included in the substrate holder 13.

Figure 2:
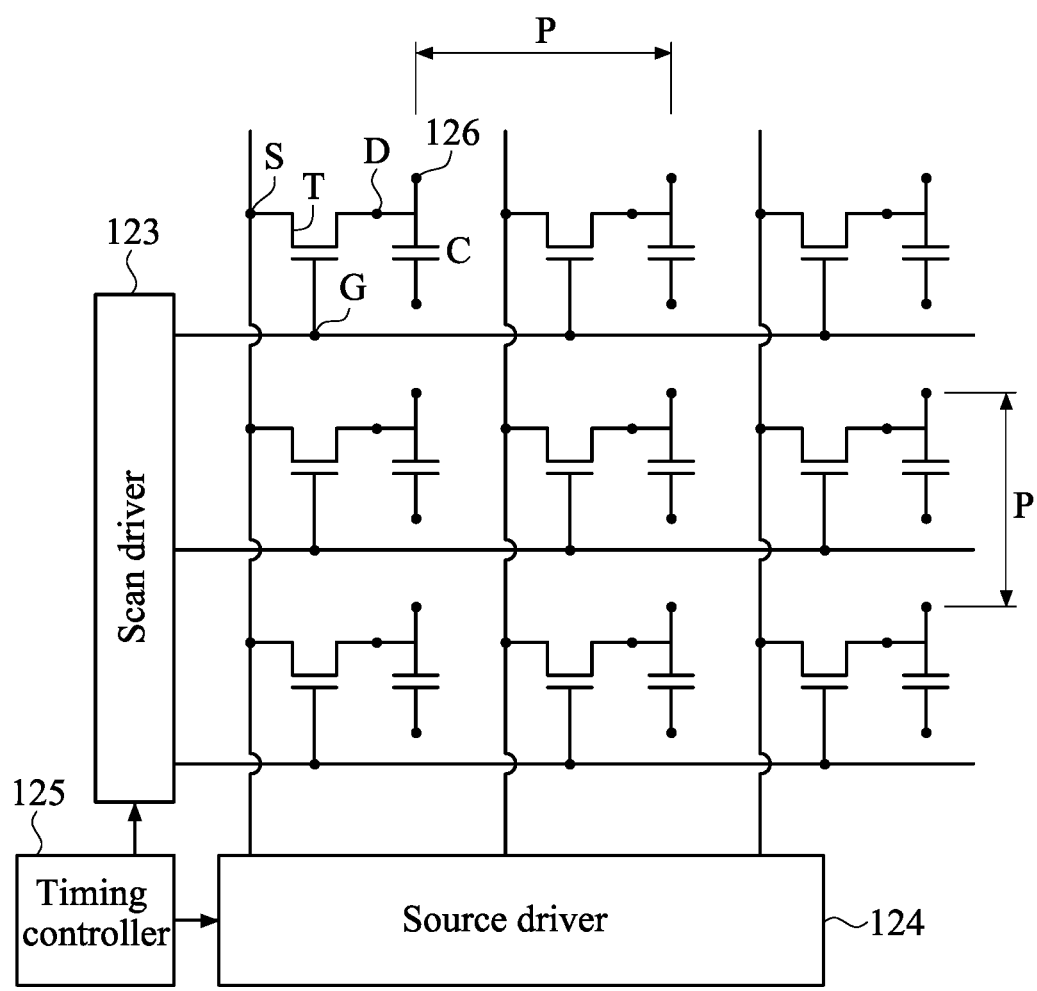
FIG. 2 shows a system block diagram illustrating the transfer head of FIG. 1.

FIG. 2 shows a system block diagram illustrating the transfer head 12 of FIG. 1. In the embodiment, the transfer head 12 may include a plurality of TFTs T, arranged in a matrix form to result in a TFT active matrix. The TFTs T at the same row are connected with gates G, which are connected to and controlled by a scan driver 123, and the TFTs T at the same column are connected with sources S, which are connected to and controlled by a source driver 124. The scan driver 123 and the source driver 124 are controlled by a timing controller 125, which is further controlled by an outer controller (not shown). The scan driver 123, the source driver 124 and the timing controller 125 are disposed on the TFT driver board 121. The drain D of each TFT T is connected to a corresponding capacitor C. According to another aspect of the embodiment, the drain D of each TFT T is also connected to the corresponding pick-up electrode 126 for picking the micro device. Space between adjacent pick-up electrodes 126 is denoted by P.

Figure 3A:
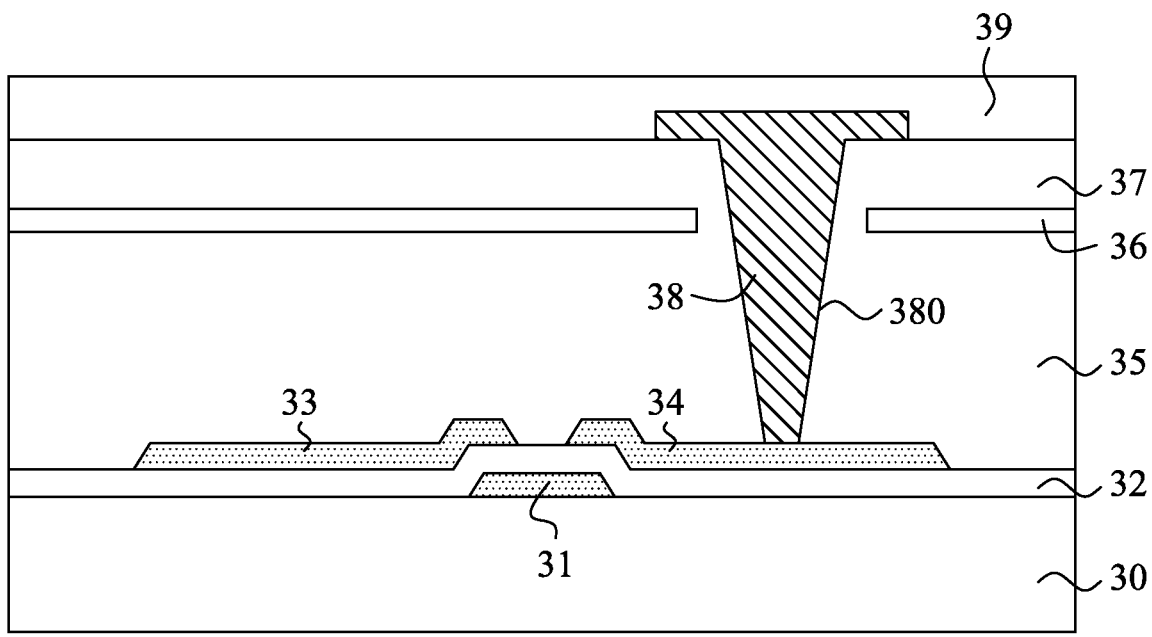
FIG. 3A shows a cross-sectional view of the TFT of FIG. 2.

FIG. 3A shows a cross-sectional view of the TFT T of FIG. 2. In the embodiment, the TFT T may include a substrate 30 such as a glass substrate. A gate conductive layer 31 (e.g., gate metal layer) acting as the gate G of the TFT T is formed on the substrate 30. A gate insulating layer 32 (e.g., nitride gate layer) is formed on the gate conductive layer 31 and the substrate 30. A source conductive layer 33 (e.g., source metal layer) and a drain conductive layer 34 (e.g., drain metal layer), acting as the source S and the drain D respectively, are formed on the gate insulating layer 32. The source conductive layer 33 and the drain conductive layer 34 overlap two ends of the gate conductive layer 31, respectively.

Figure 3B:
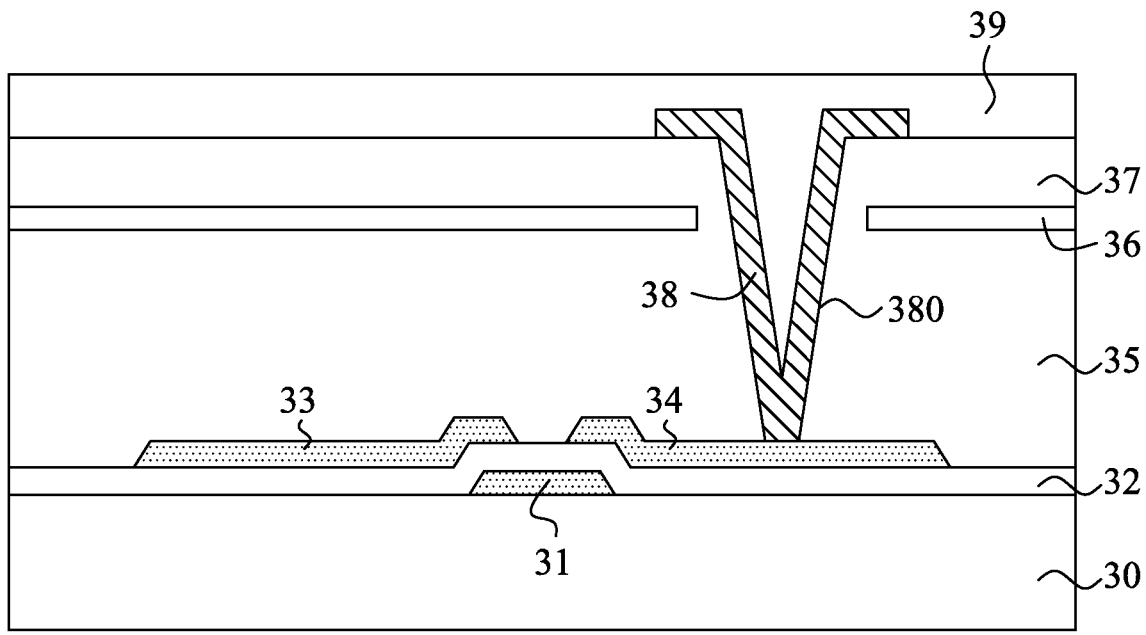
FIG. 3B shows another cross-sectional view of the TFT of FIG. 2.

The TFT T may include a planarization layer 35 (e.g., organic planarization layer) formed on the gate insulating layer 32, the source conductive layer 33 and the drain conductive layer 34. A shielding conductive layer 36 is formed on the planarization layer 35. An insulating layer 37 is formed on the shielding conductive layer 36. According to one aspect of the embodiment, a pick-up electrode layer 38 is formed on the insulating layer 37, formed in a via 380 of the insulating layer 37 and the planarization layer 35, and connected to the drain conductive layer 34. The pick-up electrode layer 38 passes through the insulating layer 37, the shielding conductive layer 36 and the planarization layer 35, and is not in contact with the shielding conductive layer 36. An overcoat layer 39 is formed on the insulating layer 37 and the pick-up electrode layer 38 for protecting the pick-up electrode 126. In one embodiment, the overcoat layer 39 may include a buffer material such that particles on the surface of the donor/acceptor substrate 14 are buffered to prevent damage of the transfer head 12. The pick-up electrode layer 38 shown in FIG. 3A fills the via 380 of the insulating layer 37 and the planarization layer 35. FIG. 3B shows another cross-sectional view of the TFT T of FIG. 2. In the embodiment, the pick-up electrode layer 38 is formed on a sidewall of the via 380.

Figure 4:
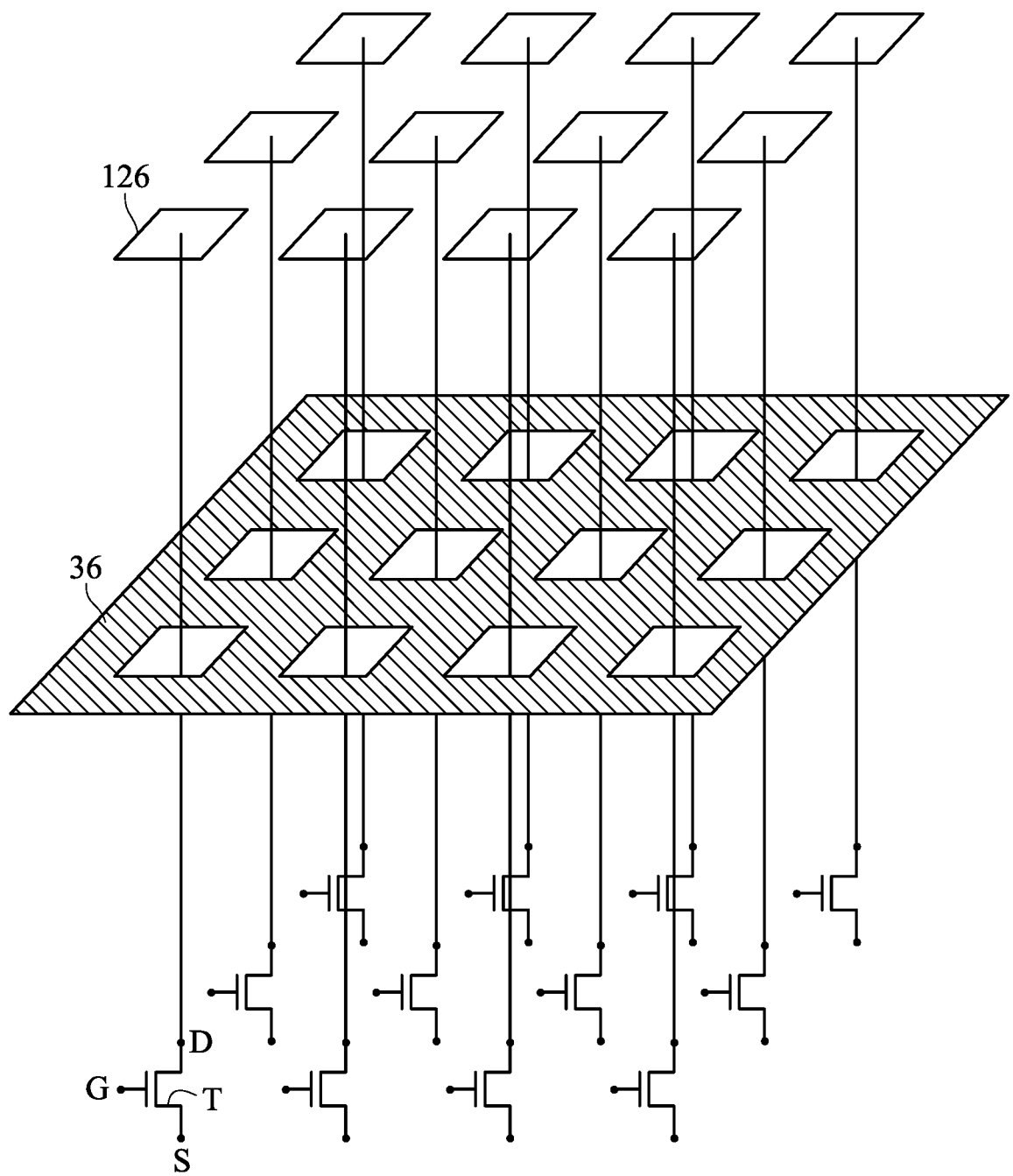
FIG. 4 shows a perspective view illustrating the TFT of FIG. 2 and FIG. 3.

FIG. 4 shows a perspective view illustrating the TFT T of FIG. 2 and FIG. 3. As shown in FIG. 4, the drain D of each TFT T is connected to corresponding pick-up electrode 126 through the shielding conductive layer 36. The shielding conductive layer 36 may prevent the pick-up electrode 126 from being faulty caused by the driving voltage of the TFT T. In one embodiment, sufficient voltage is applied to the pick-up electrode 126 to generate electrostatic force for picking the micro device. Accordingly, the TFT T should be a high-voltage device to sustain high voltage. In another embodiment, the transfer head 12 may simultaneously adopt magnetic principle to pick the micro device such that the voltage applied to the pick-up electrode 126 may be substantially reduced and the TFT T may sustain a lower applied voltage.

Figure 5:
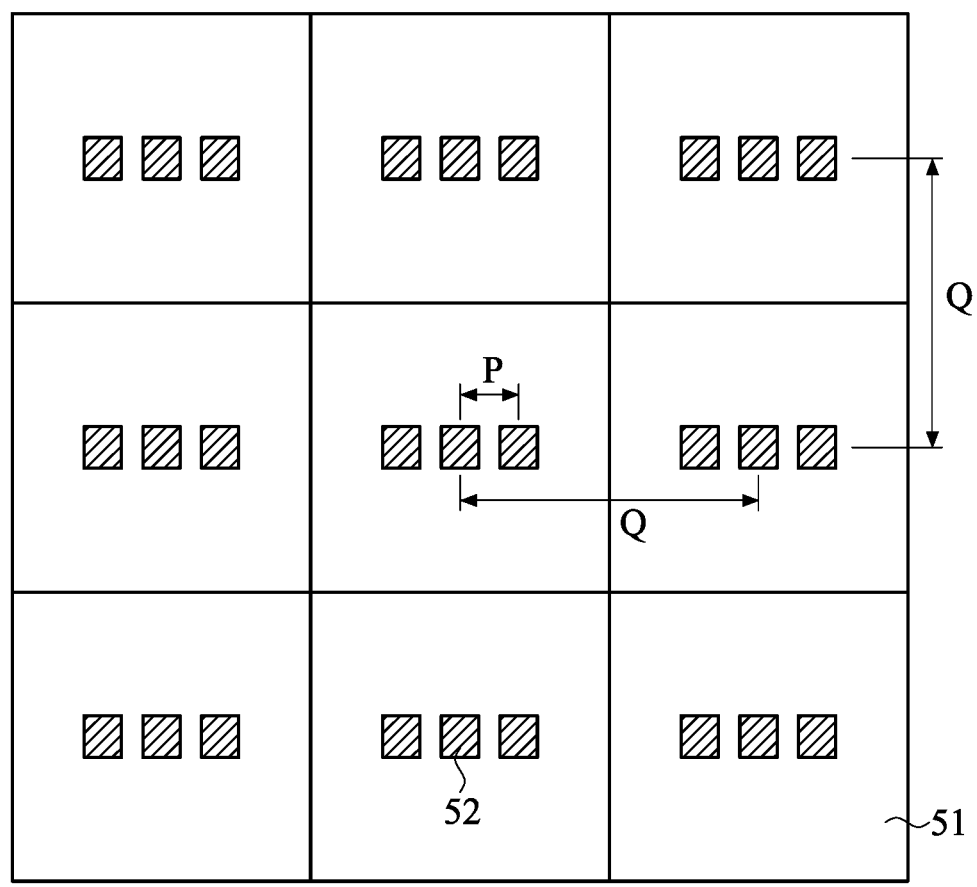
FIG. 5 shows a top view illustrating pixels of a microLED display panel supported on the acceptor substrate.

FIG. 5 shows a top view illustrating pixels 51 of a microLED display panel supported on the acceptor substrate 14. In this example, nine pixels 51 of the microLED display panel are arranged in 3×3 matrix form. P denotes space between adjacent microLEDs 52 or equivalently the space of adjacent pick-up electrodes 126 (FIG. 2). Q denotes space between adjacent pixels 51 of the microLED display panel. In the embodiment, Q is an (integer) multiple of P. Accordingly, the timing controller 125 may control the scan driver 123 and the source driver 124 to perform addressing such that the pick-up electrodes 126 of the transfer head 12 can selectively pick the microLEDs 52 and then release them on predetermined positions of the acceptor substrate 14 to perform repair task. Compared to conventional micro device transfer system, the present embodiment may greatly enhance cost benefit.

Accordingly, the embodiment utilizes TFT architecture, process and driving technique to manufacture multiple pick-up electrodes 126 to realize mass transfer of micro devices adaptable to large-size panels. As the TFTs are capable of performing addressing, the embodiment may work on single or few micro devices, for example, in repair task.

Although specific embodiments have been illustrated and described, it will be appreciated by those skilled in the art that various modifications may be made without departing from the scope of the present invention, which is intended to be limited solely by the appended claims.

What is claimed is:

1. A micro device transfer system, comprising:
   a transfer head including a plurality of pick-up electrodes for respectively picking a plurality of micro devices, and including a plurality of thin-film transistors (TFTs) respectively corresponding to the micro devices;
   a transfer head holder for holding the transfer head;
   a TFT driver board electrically connected to control the TFTs;
   a donor or acceptor substrate for supporting the micro devices; and
   a substrate holder for holding the donor or acceptor substrate;

wherein the transfer head includes a substrate on which the pick-up electrodes, the TFTs and the TFT driver board are disposed, and the substrate includes a working area and an extension part being level with the working area.

2. The system of claim 1, wherein the micro device has a size of 1-100 micrometers.

3. The system of claim 1, wherein the micro device comprises a micro light-emitting diode (microLED).

4. The system of claim 1, wherein the pick-up electrodes and the TFTs are disposed at bottom of the transfer head and located in the working area.

5. The system of claim 1, wherein the extension part extends which the working area, one end of the extension part being adjacent to the transfer head holder, and a bottom surface of another end of the extension part being connected to the TFT driver board.

6. The system of claim 1, wherein the TFTs are arranged in a matrix form to result in a TFT active matrix.

7. The system of claim 1, wherein the TFT driver board comprises:
- a scan driver coupled to control gates of the TFTs at a same row;
- a source driver coupled to control sources of the TFTs at a same column; and
- a timing controller that controls the scan driver and the source driver.

8. The system of claim 1, where a drain of the TFT is connected to the corresponding pick-up electrode.

9. The system of claim 1, wherein the TFT comprises:
- a gate conductive layer formed on the substrate, the gate conductive layer acting as a gate of the TFT;
- a gate insulating layer formed on the gate conductive layer and the substrate;
- a source conductive layer and a drain conductive layer formed on the gate insulating layer, the source conductive layer and the drain conductive layer overlapping two ends of the gate conductive layer respectively;
- a planarization layer formed on the gate insulating layer, the source conductive layer and the drain conductive layer;
- a shielding conductive layer formed on the planarization layer;
- an insulating layer formed on the shielding conductive layer; and
- a pick-up electrode layer formed on the insulating layer, formed in a via of the insulating layer and the planarization layer, and connected to the drain conductive layer, the pick-up electrode layer acting as the pick-up electrode;
- wherein the pick-up electrode layer passes through the insulating layer, the shielding conductive layer and the planarization layer, and is not in contact with the shielding conductive layer.

10. The system of claim 9, wherein the substrate of the TFT comprises a glass substrate.

11. The system of claim 9, wherein the TFT further comprises:
an overcoat layer formed on the insulating layer and the pick-up electrode layer for protecting the pick-up electrode.

12. The system of claim 11, wherein the overcoat layer comprises a buffer material.

13. The system of claim 1, wherein space between adjacent pixels of a panel supported on the acceptor substrate is a multiple of space between adjacent pick-up electrodes.

* * * * *